United States Patent
Choi

(10) Patent No.: US 10,476,510 B2
(45) Date of Patent: Nov. 12, 2019

(54) CLOCK AND DATA RECOVERY DEVICE AND METHOD USING CURRENT-CONTROLLED OSCILLATOR

(71) Applicant: Samsung Electronics Co., Ltd., Suwon-si, Gyeonggi-do (KR)

(72) Inventor: Hwang Ho Choi, Busan (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/025,508

(22) Filed: Jul. 2, 2018

(65) Prior Publication Data

US 2019/0173475 A1    Jun. 6, 2019

(30) Foreign Application Priority Data

Dec. 5, 2017  (KR) .................. 10-2017-0165842

(51) Int. Cl.
*H03L 7/08* (2006.01)
*H03L 7/085* (2006.01)
*H03L 7/099* (2006.01)

(52) U.S. Cl.
CPC ............ *H03L 7/0807* (2013.01); *H03L 7/085* (2013.01); *H03L 7/099* (2013.01)

(58) Field of Classification Search
None
See application file for complete search history.

(56) References Cited

U.S. PATENT DOCUMENTS

| | | | |
|---|---|---|---|
| 6,188,289 B1 | 2/2001 | Hyeon | |
| 7,149,914 B1 | 12/2006 | Asaduzzaman et al. | |
| 7,289,002 B2 | 10/2007 | Jeon et al. | |
| 7,580,497 B2 | 8/2009 | Wang et al. | |
| 7,602,260 B1* | 10/2009 | Atesoglu | H03B 27/00 331/186 |
| 8,169,271 B2* | 5/2012 | Goyal | H03B 19/00 331/117 FE |
| 8,860,482 B1* | 10/2014 | Liu | H03L 7/099 327/148 |
| 9,306,730 B1 | 4/2016 | Shu et al. | |
| 9,325,328 B2 | 4/2016 | Sawada et al. | |
| 2008/0100390 A1* | 5/2008 | Novac | H03B 5/04 331/116 FE |
| 2009/0115536 A1* | 5/2009 | Dai | H03L 7/087 331/44 |
| 2009/0160511 A1 | 6/2009 | Sudo | |
| 2010/0091925 A1 | 4/2010 | Nedovic et al. | |

(Continued)

FOREIGN PATENT DOCUMENTS

KR    101002242 B1    12/2010

*Primary Examiner* — Cassandra F Cox
(74) *Attorney, Agent, or Firm* — Harness, Dickey & Pierce, P.L.C.

(57) ABSTRACT

A clock and data recovery device associated with a data receiving apparatus, the clock and data recovery device including an oscillator configured to generate a clock signal; and a regulator configured to supply current to the oscillator, the regulator including, a first current source configured to supply a first current to the oscillator, and a second current source configured to supply a second current to the oscillator such that the second current is supplied to the oscillator, after a period of time, to de-emphasize the first current, the period of time being based on the first current.

20 Claims, 16 Drawing Sheets

(56) References Cited

U.S. PATENT DOCUMENTS

| | | | |
|---|---|---|---|
| 2011/0032026 A1* | 2/2011 | Pelley | H02M 3/07 327/536 |
| 2013/0076450 A1* | 3/2013 | Rao | H03L 7/0896 331/34 |
| 2013/0181781 A1* | 7/2013 | Tan | H03K 3/02 331/57 |
| 2013/0222067 A1* | 8/2013 | Yin | H03L 7/099 331/25 |
| 2015/0137773 A1* | 5/2015 | Miller | H02M 3/073 323/234 |
| 2016/0013927 A1 | 1/2016 | Lee et al. | |
| 2017/0149329 A1 | 5/2017 | Wang | |

* cited by examiner

CLOCK AND DATA RECOVERY DEVICE AND METHOD USING CURRENT-CONTROLLED OSCILLATOR

CROSS-REFERENCE TO RELATED APPLICATION

This application claims the priority and benefit of Korean Patent Application No. 10-2017-0165842, filed on Dec. 5, 2017, with the Korean Intellectual Property Office, the entire contents of which is incorporated herein by reference.

BACKGROUND

1. Field

Example embodiments of the inventive concepts relate to a data receiving apparatus in a communication system. For example, at least some example embodiments relate to a clock and data recovery device and/or method using a current-controlled oscillator.

2. Description of Related Art

In a serial data communication system, a transmitting apparatus may transmit serial data to a receiving apparatus at high speed using one or a small number of data buses. The receiving apparatus may recover timing information and the transmitted data from the received serial data, known as a clock and data recovery (CDR) process. The clock and data recovery process may include generating a reference clock signal from the received serial data and recovering the data transmitted from the transmitting apparatus using the reference clock signal.

SUMMARY

Example embodiments of the inventive concepts provide a clock and data recovery device including a current-controlled oscillator (CCO) responding immediately to changes in input data by compensating for a large RC time constant of a metal routing extending from an output terminal of a current source of the current-controlled oscillator to an oscillator using current equalization.

Other example embodiments of the inventive concepts provide a clock and data recovery device including a current-controlled oscillator having a high operating frequency.

According to an example embodiment of the inventive concepts, a clock and data recovery device includes an oscillator configured to generate a clock signal; and a regulator configured to supply current to the oscillator, the regulator including, a first current source configured to supply a first current to the oscillator, and a second current source configured to supply a second current to the oscillator such that the second current is supplied to the oscillator, after a period of time, to de-emphasize the first current, the period of time being based on the first current.

According to another example embodiment of the inventive concepts, a clock and data recovery device includes an oscillator configured to generate a synchronized clock signal, the data receiving apparatus configured to receive incoming data based on the synchronized clock signal; a variable capacitor configured to selectively adjust a frequency of the oscillator when the oscillator is operated at a frequency higher than a set frequency; and a regulator configured to supply current to the oscillator, and to selectively adjust the frequency of the oscillator by adjusting the current supplied to the oscillator when the oscillator is operated at a frequency lower than the set frequency.

According to another example embodiment of the inventive concepts, a clock and data recovery method includes generating a clock signal by driving an oscillator; generating a control signal based on the clock signal and incoming data; and supplying different ones of a first current and a second current to the oscillator based on the control signal such that the second current is supplied to the oscillator, after a period of time to de-emphasize the first current, the period of time being based on the first current.

According to another example embodiment of the inventive concepts, a clock and data recovery method includes generating a synchronized clock signal to receive incoming data; selectively adjusting a frequency of the synchronized clock signal using a variable capacitor when an oscillator is operated at a frequency higher than a set frequency; and adjusting the frequency of the synchronized clock signal by controlling current supplied to the oscillator by controlling the current supplied to the oscillator when the oscillator is operated at a frequency lower than the set frequency.

BRIEF DESCRIPTION OF DRAWINGS

The above and other aspects, features, and advantages of the inventive concepts will be more clearly understood from the following detailed description taken in conjunction with the accompanying drawings, in which.

DETAILED DESCRIPTION

Figure 1:
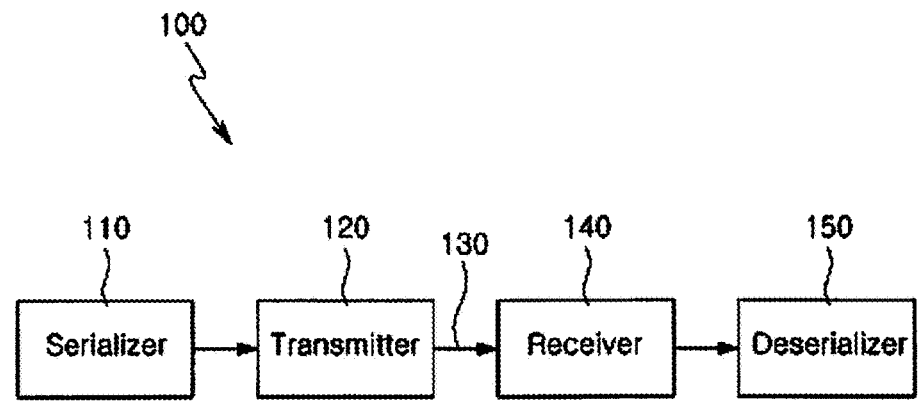
FIG. 1 is a block diagram illustrating a communication system according to an example embodiment of the inventive concepts.

Hereinafter, various example embodiments of the inventive concepts will be described with reference to the accompanying drawings. Example embodiment inventive concepts may, however, be embodied in many different forms and should not be construed as being limited to the specific example embodiments set forth herein. Rather, these example embodiments are provided so that this disclosure will be thorough and complete, and will fully convey the scope of the disclosure to those skilled in the art. In the drawings, the shapes and dimensions of elements may be exaggerated for clarity.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the example embodiments.

The terminology used herein is for describing particular example embodiments only and is not intended to be limiting of the inventive concepts. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, example embodiments of the inventive concepts will be described with reference to drawings. Clock and data recovery (CDR) devices according to the example embodiments of the inventive concepts may have various configurations. Here, only necessary configurations of the clock and data recovery devices may be shown, and those will not limit the scope of the example embodiments of the inventive concepts.

FIG. 1 is a block diagram illustrating a serial data communication system according to an example embodiment of the inventive concepts.

Referring to FIG. 1, a serial data communication system 100 may transmit data at high speed using one or a small number of buses. The serial data communication system 100 may include a serializer 110, a transmitter 120, a serial bus 130, a receiver 140, and a deserializer 150.

The serializer 110 may convert parallel data into serial data, and the transmitter 120 may transmit the converted serial data through the serial bus 130. The receiver 140 may receive the serial data transmitted through the serial bus 130, and the deserializer 150 may convert the received serial data into parallel data.

The receiver 140 in the serial data communication system 100 may include a clock and data recovery device configured to recover timing information and incoming data from the received serial data. The clock and data recovery device may generate a reference clock signal from the received serial data and recover the incoming data transmitted from a transmitting apparatus.

Example embodiments of the inventive concepts may be applied to all SerDes receivers using clock and data recovery devices. For example, example embodiments of the inventive concepts may be applied to receivers, such as a Peripheral Component Interconnect express (PCIe), a Universal Serial Bus (USB), a multi-PHY layer 14 (MPHY), a high definition multimedia interface (HDMI), DisplayPort, and V-by-One. The receivers listed above are only examples, and example embodiments of the inventive concepts may also be applied to receivers of other types of communication systems.

Figure 2:
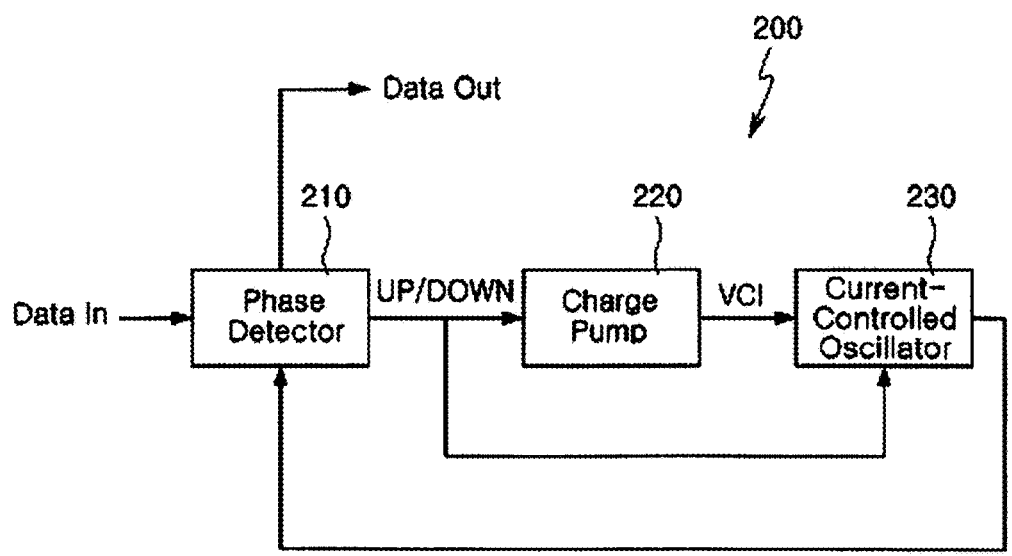
FIG. 2 is a block diagram illustrating a phase-locked loop (PLL) type clock and data recovery device according to an example embodiment of the inventive concepts.

FIG. 2 is a block diagram illustrating a clock and data recovery device according to an example embodiment of the inventive concepts.

Referring to FIG. 2, a clock and data recovery device 200 according to an example embodiment of the inventive concepts may be a phase-locked loop (PLL) type clock and data recovery device. The clock and data recovery device 200 may include a phase detector 210, a charge pump 220, and a current-controlled oscillator 230.

The phase detector 210 may receive incoming data transmitted through a serial bus and a clock signal generated in the current-controlled oscillator 230, and output a control signal by comparing a phase of the received data with a phase of the clock signal. For example, the phase detector 210 may output an UP signal when the phase of the received data is ahead of the phase of the clock signal, and may output a DOWN signal when the phase of the clock signal of the oscillator is ahead of the phase of the received data. In addition, the phase detector 210 may recover the incoming data from the received data based on the clock signal generated in the current-controlled oscillator 230.

The charge pump 220 may receive the control signal output from the phase detector 210, and output a control voltage VCI controlling the current-controlled oscillator 230. For example, the charge pump 220 may include a current supply circuit (not illustrated) and a current sink circuit (not illustrated). When the charge pump 220 receives the UP signal from the phase detector 210, the control voltage VCI may rise by the current supply circuit (not illustrated). When the charge pump 220 receives the DOWN signal from the phase detector 210, the control voltage VCI may drop by the current sink circuit (not illustrated).

The current-controlled oscillator 230 may receive the control voltage VCI from the charge pump 220 and the control signal (UP signal/DOWN signal) from the phase detector 210 to generate the clock signal.

The current-controlled oscillator 230 may include a regulator (not illustrated) and an oscillator (not illustrated). The regulator may include one or more current sources or current branches (hereinafter, called as current sources), and the one or more current sources may be connected to supply current to the oscillator in parallel. The current sources may include one or more transistors, and the transistors may be controlled by the control voltage VCI from the charge pump 220 and the control signal (UP signal/DOWN signal) from the phase detector 210. The oscillator may receive the current from the regulator to generate the clock signal. The oscillator may be a ring oscillator. However, the ring oscillator is only an example of the oscillator, and example embodiments of inventive concepts may be implemented using another type oscillator.

The phase-locked loop (PLL) type clock and data recovery device including the current-controlled oscillator 230 may be controlled using current, and thereby variations in frequency may be finely controlled. However, since the current passes through a metal routing to be supplied to the current-controlled oscillator 230 from the transistors of the regulator, a rising time and a dropping time may come after a certain amount of time delay. The amount of time delay may not be large compared to a frequency of the oscillator at low data rates. However, the UP signal and the DOWN signal generated in the phase detector 210 may not be immediately reflected in the current-controlled oscillator 230 at high data rates due to the rising time and dropping time.

Figure 3A:
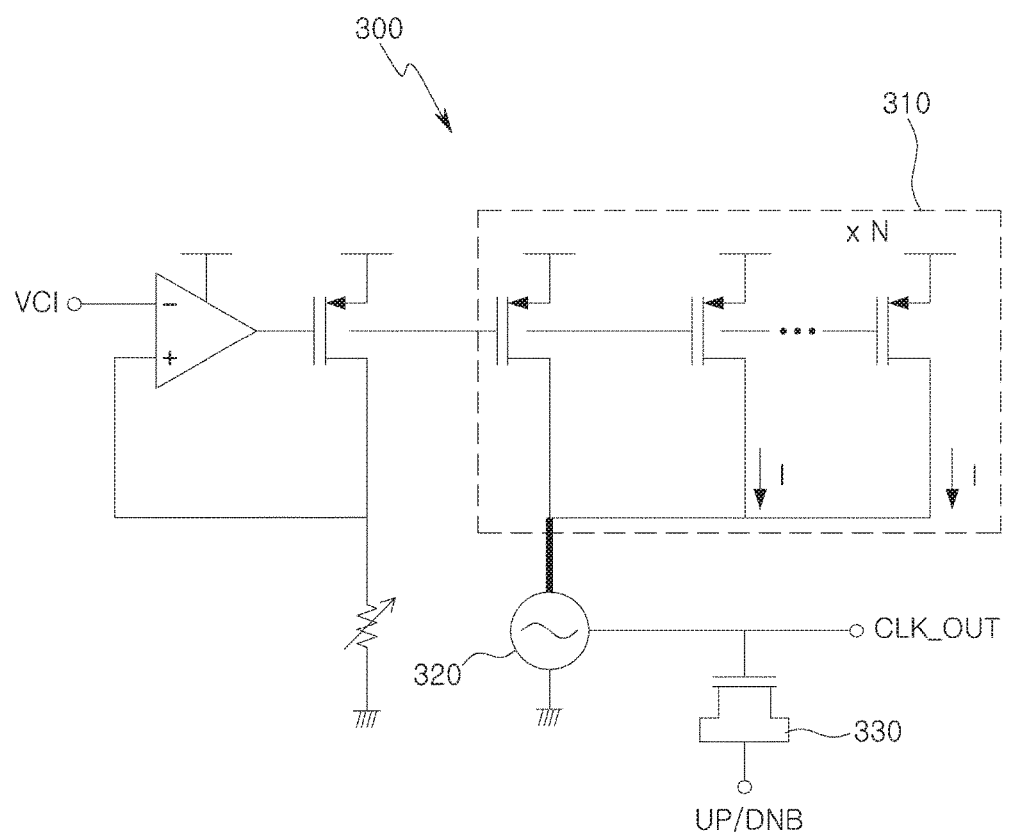
FIG. 3A is a circuit diagram illustrating an example embodiment of a current-controlled oscillator used in the clock and data recovery device illustrated in FIG. 2.

FIG. 3A is a circuit diagram illustrating an example embodiment of a current-controlled oscillator 300 used in the clock and data recovery device illustrated in FIG. 2.

Referring to FIG. 3, the current-controlled oscillator 300 may include a regulator 310 and an oscillator 320. As discussed below, in the current-controlled oscillator 300, UP/DOWN signals generated from the phase detector 210 may be immediately reflected in the oscillator 320.

The regulator 310 may include N current sources connected in parallel, and the N current sources may supply current to the oscillator 320. Each current source may include a transistor, and the transistor may be biased by a control voltage (a VCI voltage) output from the charge pump 220. The oscillator 320 may receive the current from the regulator 310 to generate a clock signal.

The current-controlled oscillator 300 according to the example embodiment of the inventive concepts may include a variable capacitor 330 connected to an output terminal of the oscillator 320 so that the UP/DOWN signals generated in the phase detector are immediately reflected in the oscillator 320. The control signal (UP/DOWN signals) of the phase detector may be applied to the variable capacitor 330 to control capacitance of the variable capacitor 330 and thereby change a frequency of the oscillator 320. In some example embodiments, the variable capacitor 330 may be a varactor. The varactor may be connected to the output terminal of the oscillator 320. The capacitance of the varactor may decrease when the UP signal is input, and may increase when the DOWN signal is input. Since the UP/DOWN signals of the phase detector are immediately reflected in the varactor, characteristics of the input data may be easily tracked by adjusting an output capacitance of the oscillator 320 and changing an oscillation frequency of the oscillator 320.

Meanwhile, the output capacitance of the oscillator 320 may increase since the variable capacitor 330 is directly connected to the oscillator 320. Accordingly, more current may be required to output a high frequency. However, since there may be limitations the magnitude of operating voltage of the oscillator 320 due to the reliability of the oscillator 320, the maximum operating frequency of the oscillator 320 may be lowered and power consumption may increase.

Figure 3B:
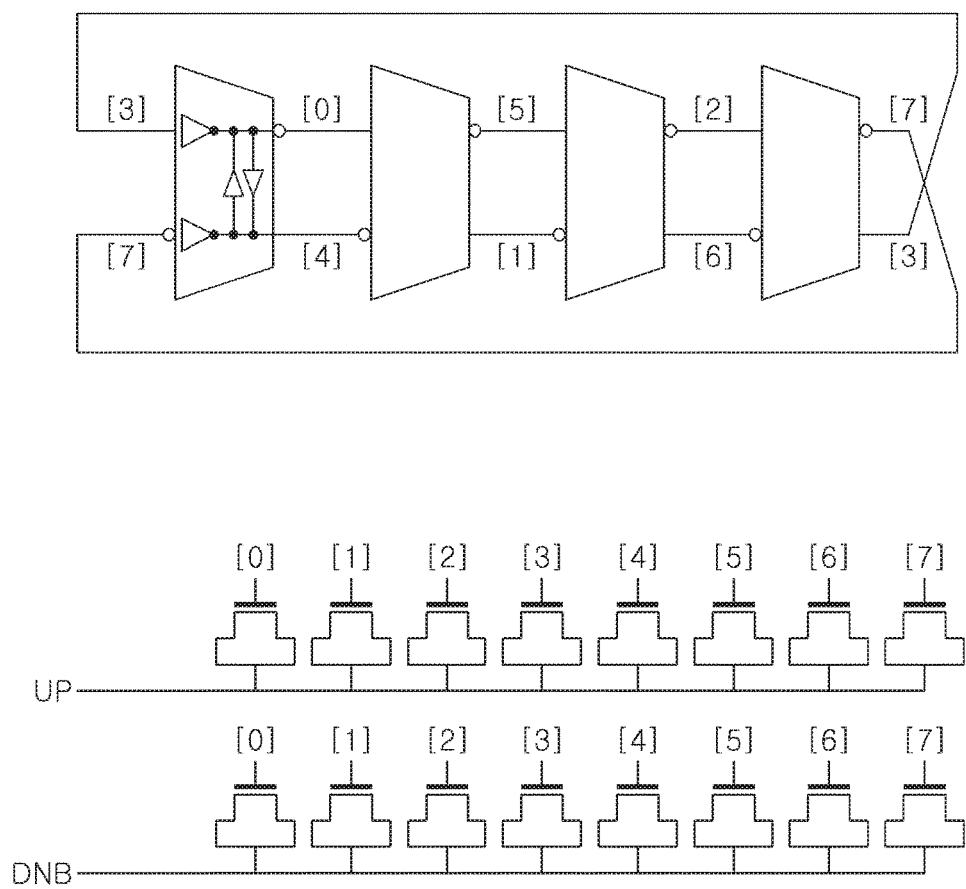
FIG. 3B is a view illustrating implementation of the oscillator and the variable capacitor illustrated in FIG. 3A.

FIG. 3B is a view of implementation of the oscillator 320 and the variable capacitor 330 illustrated in FIG. 3A. In an example embodiment, the oscillator may include a plurality of delay cells, and each of the delay cells may include a plurality of inverters. The oscillator may generate 8 clocks [0:7] in one cycle, and each clock may be sequentially delayed by ⅛ of a cycle. The variable capacitor 330 may be connected to an output terminal where each clock is generated, and controlled by the UP signal/DOWN signal.

Figure 4A:
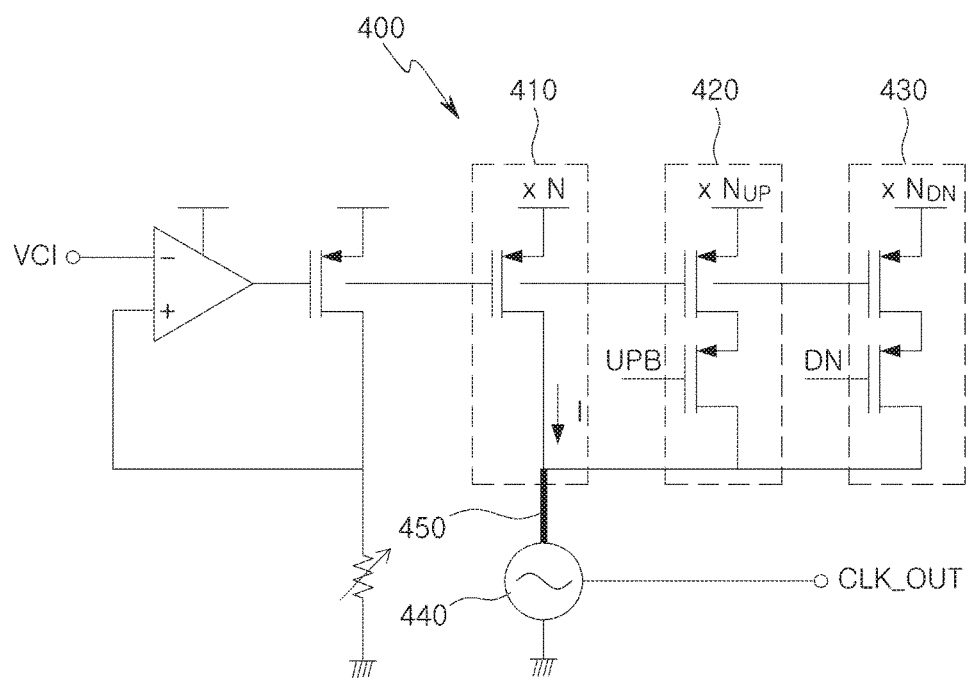
FIG. 4A is a circuit diagram illustrating another example embodiment of a current-controlled oscillator used in the clock and data recovery device illustrated in FIG. 2.

FIG. 4A is a circuit diagram illustrating another example embodiment of a current-controlled oscillator used in the clock and data recovery device illustrated in FIG. 2.

Referring to FIG. 4, a current-controlled oscillator 400 according to example embodiments of the inventive concepts may include a regulator and an oscillator 440. The current-controlled oscillator 400 may have a structure in which a variable capacitor is not connected to an output terminal of an oscillator.

The regulator may include N main current sources 410 connected in parallel, and each of the main current sources 410 may include a transistor controlled by a control voltage (VCI voltage) output from a charge pump. Two auxiliary current sources 420 and 430 may be connected to each of the main current sources 410 in parallel, and each of the auxiliary current sources 420 and 430 may include a transistor controlled by the control voltage (VCI voltage) output from the charge pump and a transistor controlled by a control signal (UP/DOWN signals) output from a phase detector. The main current sources 410 and the auxiliary current sources 420 and 430 may supply current to the oscillator 440.

The oscillator 440 may receive the current from the main current sources 410 and the auxiliary current sources 420 and 430 to generate a clock signal. Since the variable capacitor is not connected to the output terminal of the oscillator 440, the control signal generated from the phase detector may be applied to the auxiliary current sources 420 and 430 supplying the current to the oscillator 440. When an UP signal is input, the auxiliary current sources 420 and 430 may increase a frequency of the oscillator 440 by increasing the current supplied to the oscillator 440. When a DOWN signal is input, the auxiliary current sources 420 and 430 may decrease the frequency of the oscillator 440 by decreasing the current supplied to the oscillator 440.

The current supplied from the main current sources 410 and the auxiliary current sources 420 and 430 may pass through a metal routing 450 extending from output terminals of the main current sources 410 and auxiliary current sources 420 and 430 to the oscillator 440. The metal routing 450 may have a form of a power mesh, and connect a large capacitor on a voltage applied to the oscillator 440 to be resistant to noise. Accordingly, the metal routing 450 may have a large capacitance. Resistance directed to the oscillator 440 and the large capacitance of the metal routing 450 may act as an RC low pass filter. Accordingly, when the UP signal is input, the current supplied to the oscillator 440 may not be immediately reflected but be slowly reflected.

Figure 4B:
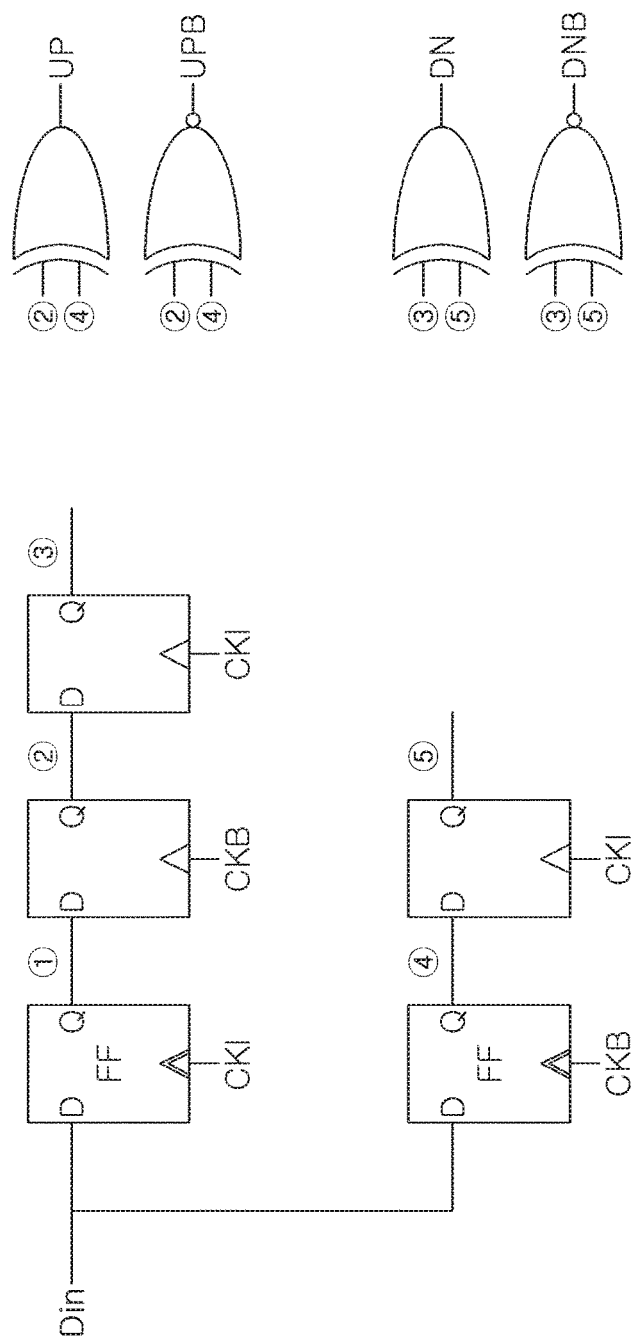
FIG. 4B is a view of a circuit generating the UPB signal/DN signal applied to the current-controlled oscillator illustrated in FIG. 4A.
Figure 4C:
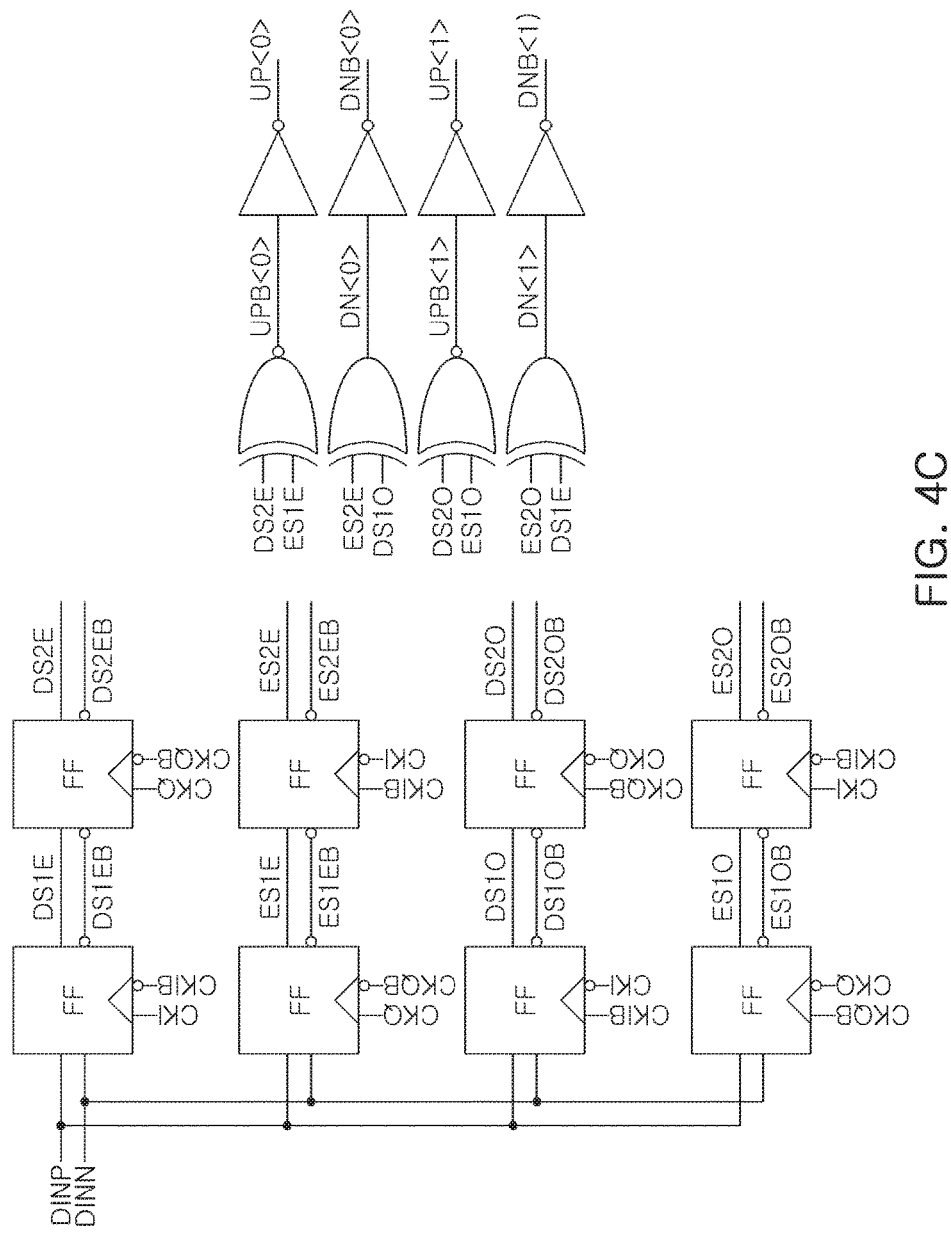
FIG. 4C is another view of a circuit generating the UPB signal/DN signal applied to the current-controlled oscillator illustrated in FIG. 4A.

FIG. 4B is a view of a circuit generating the UPB signal/DN signal applied to the current-controlled oscillator illustrated in FIG. 4A, and FIG. 4C is another view of a circuit generating the UPB signal/DN signal applied to the current-controlled oscillator illustrated in FIG. 4A. The circuit generating the UPB signal/DN signal illustrated in FIG. 4B may be applied in the case of a full-rate clock and data recovery, and the circuit generating the UPB signal/DN signal illustrated in FIG. 4C may be applied in the case of a half-rate clock and data recovery.

Figure 5:
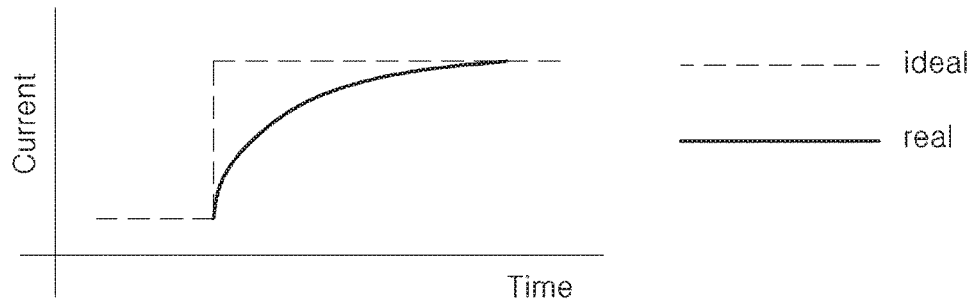
FIG. 5 is a diagram illustrating current waveforms obtained in a case in which the current-controlled oscillator illustrated in FIG. 4 is employed.

FIG. 5 is a diagram illustrating current waveforms obtained in a case in which the current-controlled oscillator illustrated in FIG. 4 is employed.

Referring to FIG. 5, the current waveform may be similar to an output voltage output after an input voltage having a step function passes through a low pass filter. The rising time or the dropping time may be approximated with a certain amount of time delay, which prevents the oscillator immediately tracking input data. Accordingly, a sampling margin of the phase detector may be reduced.

Figure 6:
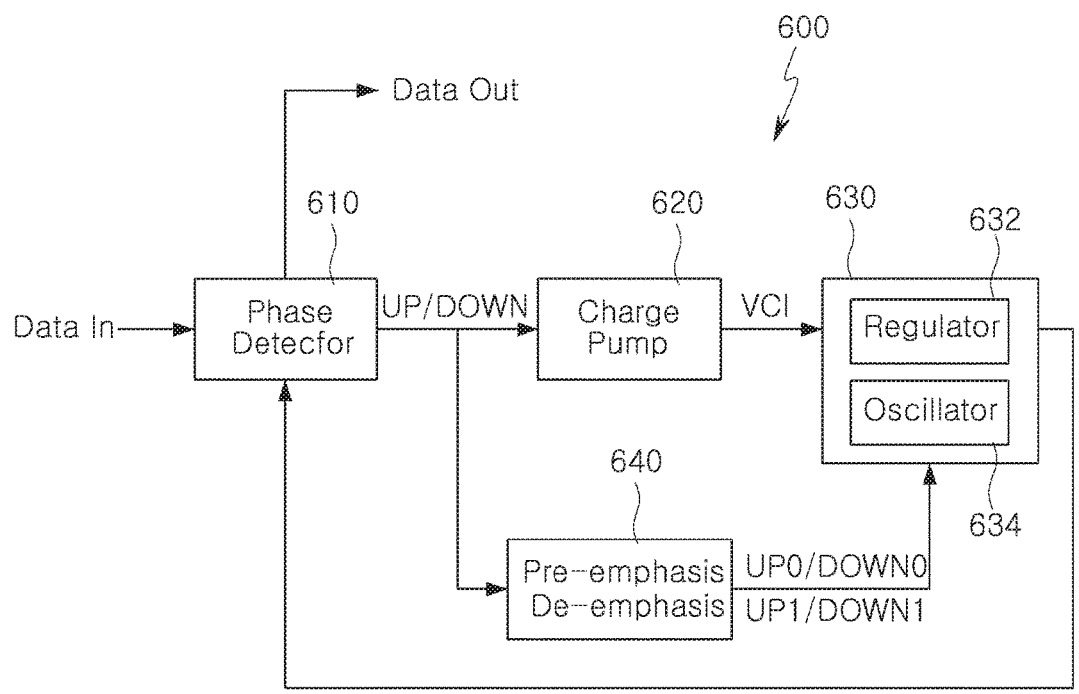
FIG. 6 is a block diagram illustrating a clock and data recovery device according to another example embodiment of the inventive concepts.

FIG. 6 is a block diagram illustrating a clock and data recovery device according to another example embodiment of the present inventive concepts.

Referring to FIG. 6, a clock and data recovery device 600 according to example embodiment of the inventive concepts may be a phase-locked loop (PLL) type clock and data recovery device.

The clock and data recovery device 600 may include a phase detector 610, a charge pump 620, a current-controlled oscillator 630, and a de-emphasis/pre-emphasis controller 640. The current-controlled oscillator 630 may include an oscillator 634 generating a clock signal, and a regulator 632 supplying current to the oscillator 634. Since the phase detector 610 and the charge pump 620 are similar to the phase detector 210 and charge pump 220 illustrated in FIG. 2, duplicated descriptions thereof will be omitted.

The de-emphasis/pre-emphasis controller 640 may receive a control signal (UP/DOWN signals) from the phase detector 610 to output a de-emphasis control signal or a pre-emphasis control signal.

For example, the de-emphasis control signal may be UP0/DOWN0 signals or UP1/DOWN1 signals. The UP0/DOWN0 signals may be the same as the UP/DOWN signals input to the de-emphasis/pre-emphasis controller 640. The UP1/DOWN1 signals may be signals obtained by delaying the input UP signal/DOWN signal for a desired (or, alternatively, a predetermined) period of time and performing bit inversion on the delayed UP/DOWN signals.

The pre-emphasis control signal may be UP0/DOWN0 signals or UP2/DOWN2 signals. The UP0/DOWN0 signals may the same as the UP/DOWN signals input to the de-emphasis/pre-emphasis controller 640, and the UP2/DOWN2 signals may be signals obtained by performing bit inversion at a desired (or, alternatively, a predetermined) period of time by advancing of the UP/DOWN signals input to the de-emphasis/pre-emphasis controller 640.

The regulator 632 of the current-controlled oscillator 630 may receive the de-emphasis control signal or the pre-emphasis control signal from the de-emphasis/pre-emphasis controller 640 and supply the current to the oscillator 634, based on the de-emphasis control signal or the pre-emphasis control signal. By controlling the current supplied to the oscillator 634 based on the de-emphasis control signal or the pre-emphasis control signal, changes in the input data may be immediately reflected in the oscillator 634.

Figure 7A:
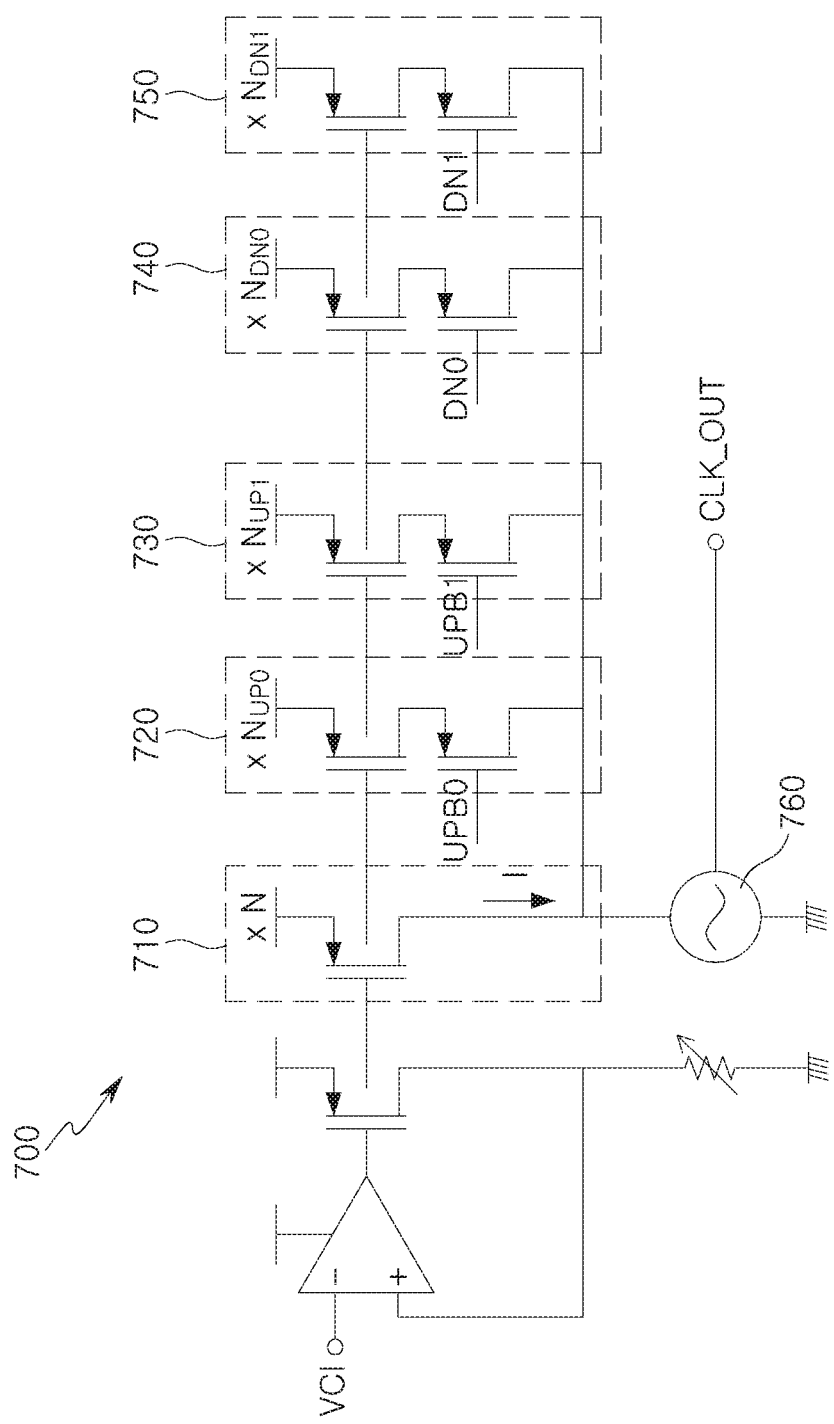
FIG. 7A is a circuit diagram illustrating an example embodiment of a current-controlled oscillator used in the clock and data recovery device illustrated in FIG. 6.

FIG. 7A is a circuit diagram illustrating an example embodiment of a current-controlled oscillator used in the clock and data recovery device illustrated in FIG. 6.

Referring to FIG. 7, a current-controlled oscillator 700 according to example embodiments of the inventive concepts may include a regulator (e.g., the regulator 632) and an oscillator 760.

The regulator may include N main current sources 710 and auxiliary current sources 720 to 750 connected to the main current sources 710 in parallel. The main current sources 710 may be controlled by a control voltage (a VCI voltage) output from a charge pump, and the auxiliary current sources 720 to 750 may be controlled by a control signal output from a de-emphasis/pre-emphasis controller. That is, the auxiliary current sources 720 to 750 may be controlled by UP0/DN0 signals or UP1/DN1 signals. The UP0 signal (here, the UPB0 signal is a signal obtained by inverting the UP0 signal) and the DN0 signal is respectively the same as an UP signal and a DOWN signal output from a phase detector, and the UP1 signal (here, the UPB1 signal is a signal obtained by inverting the UP1 signal) and DN1 signal are respectively obtained by delaying the UP signal and the DOWN signal by a desired (or, alternatively, a predetermined) period of time, then performing bit inversion on the delayed signals, and then multiplying the bit-inverted signals by a constant scale.

Figure 7B:
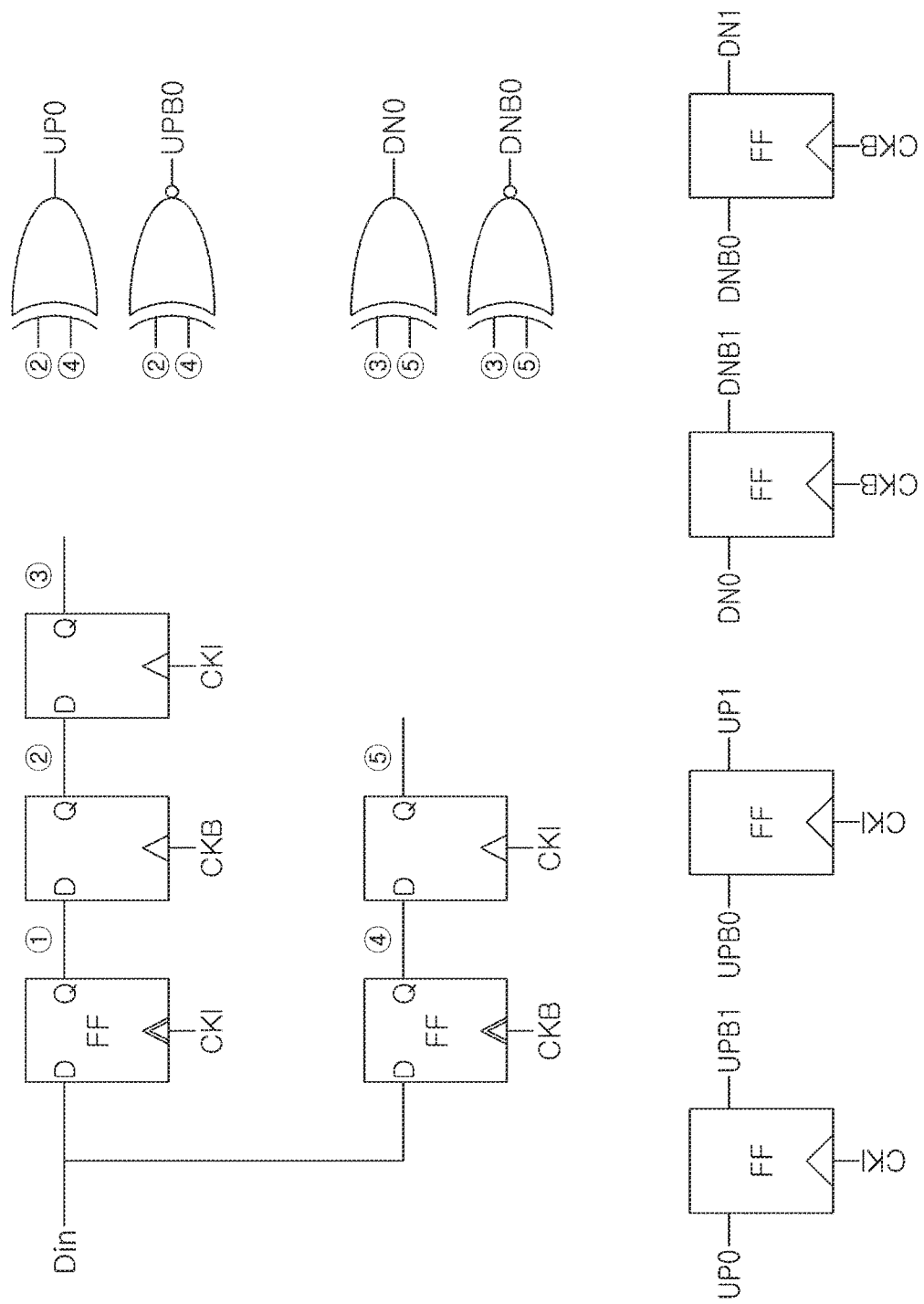
FIG. 7B is a view of a circuit generating the UPB0 signal/UPB1 signal/DN0 signal/DN1 signal applied to the current-controlled oscillator illustrated in FIG. 7A.

FIG. 7B is a view of a circuit generating the UPB0 signal/UPB1 signal/DN0 signal/DN1 signal applied to the current-controlled oscillator illustrated in FIG. 7A. The delayed signal of the UP0 signal becomes the UPB1 signal, since the polarity of the current due to the UPB0 signal is opposite to the polarity of the current due to the UPB1 signal. This will be described in more detail with reference to FIG. 8 below.

Figure 8A:
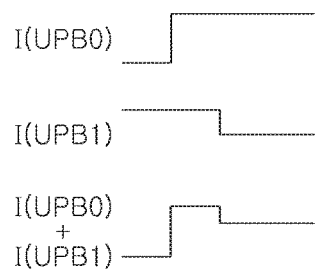
FIGS. 8A and 8B are diagrams illustrating current waveforms obtained in a case in which the current-controlled oscillator illustrated in FIG. 7 is employed.
Figure 8B:
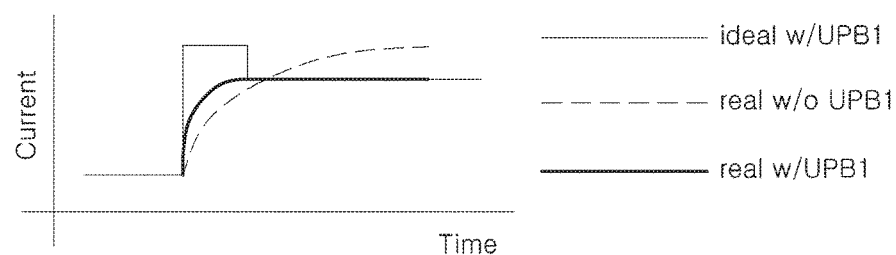

FIGS. 8A and 8B is a diagram illustrating current waveforms obtained in a case in which the current-controlled oscillator illustrated in FIG. 7A is employed.

Referring to FIGS. 8A and 8B, FIG. 8A illustrates ideal current waveforms I(UPB0) and I(UPB1), and a current waveform of I(UPB0)+I(UPB1) obtained when applying the UPB0 signal and the UPB1 signal, which are the de-emphasis control signals, and FIG. 8B illustrates real waveforms obtained when the UPB0 signal and the UPB1 signal are input to the auxiliary current sources 720 and 730.

When the UP signal UPB1 is input, the increase in current supplied to the oscillator 760 may be equal to a value obtained by performing de-emphasizing using a step function. Therefore, since a high frequency component is boosted in the de-emphasized current, the rising time and the dropping time may be reduced even when the de-emphasized current passes through the metal routing acting as a low pass filter. The clock and data recovery device according to example embodiment of the inventive concepts may respond immediately to changes in input data.

Figure 9A:
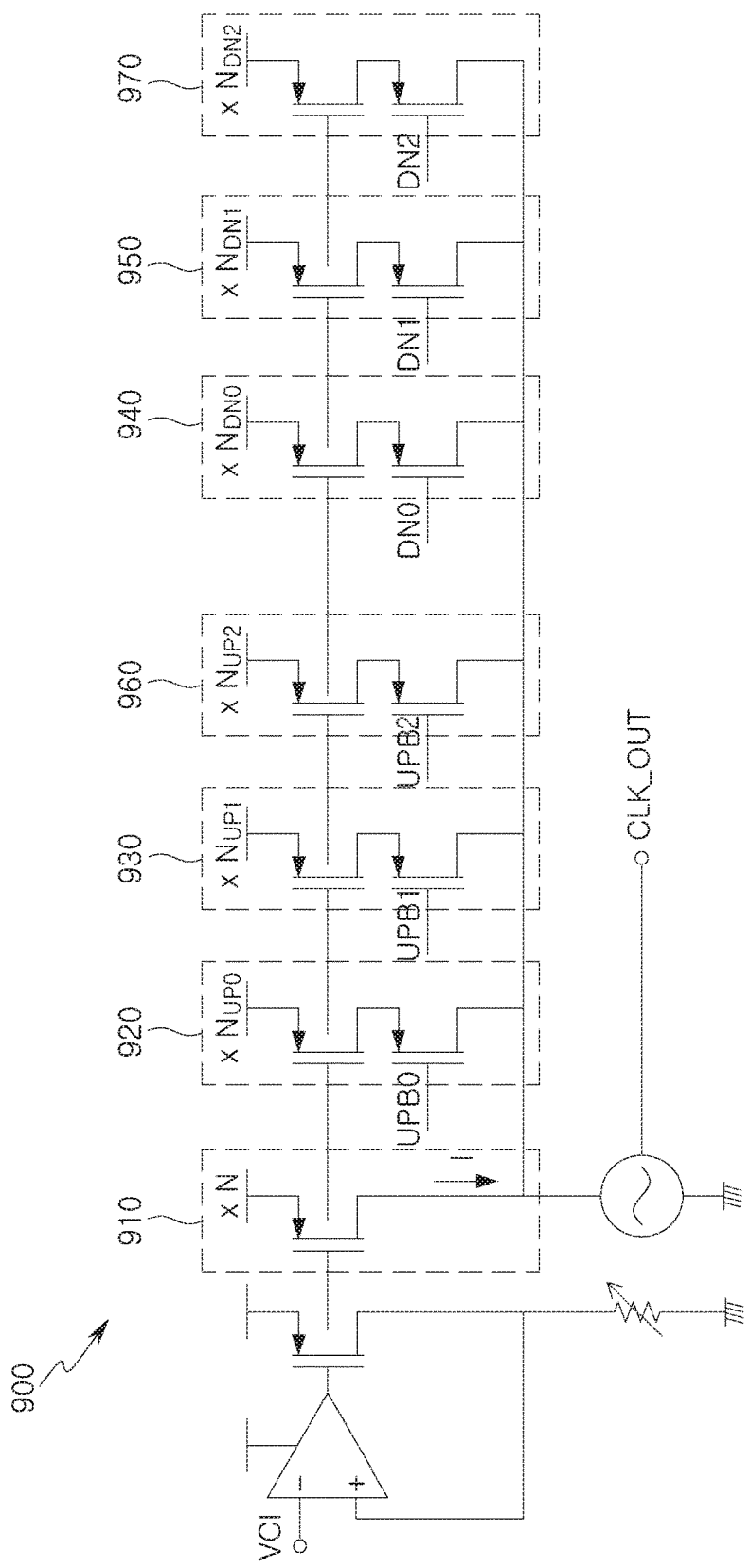
FIG. 9A is a circuit diagram illustrating another example embodiment of a current-controlled oscillator used in the clock and data recovery device illustrated in FIG. 6.

FIG. 9A is a circuit diagram illustrating another example embodiment of a current-controlled oscillator used in the clock and data recovery device illustrated in FIG. 6.

Referring to FIG. 9, a current-controlled oscillator 900 according to example embodiments of the inventive concepts may include a regulator and an oscillator, and a de-emphasis control method and a pre-emphasis control method may be applied thereto.

The regulator, similar to the regulator illustrated in FIG. 7, may include N main current sources 910 and auxiliary current sources 920 to 950 connected to the N main current sources 910 in parallel. The auxiliary current sources 920 to 950 may be controlled by a de-emphasis control signal, and the auxiliary current sources 960 and 970 may be controlled by a pre-emphasis control signal. That is, the auxiliary current sources 920 and 940 may include a transistor controlled by UP0/DN0 signals, the auxiliary current sources 930 and 950 may include a transistor controlled by UP1/DN1 signals, and the auxiliary current sources 960 and 970 may include a transistor controlled by UP2/DN2 signals.

Figure 9B:
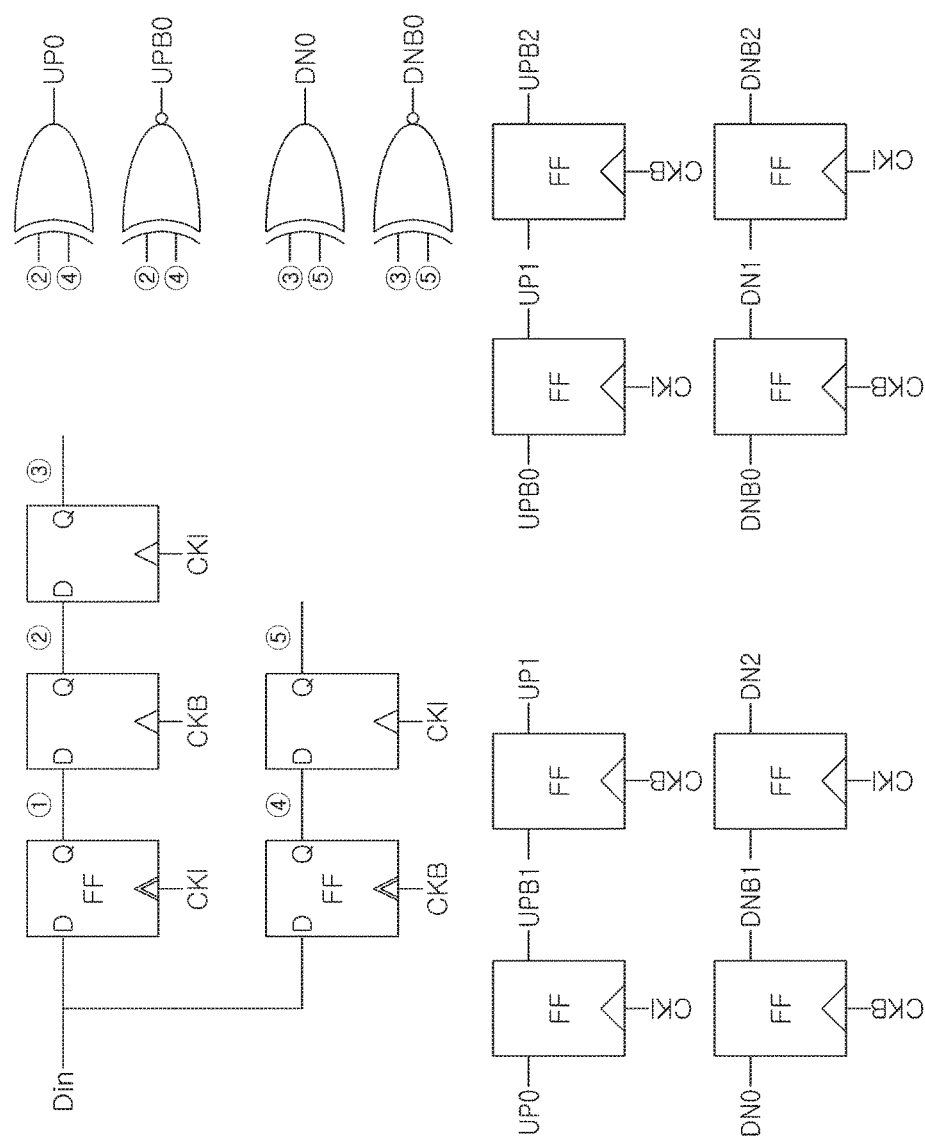
FIG. 9B is a view of a circuit generating the UPB0 signal/UPB1 signal/UPB2 signal/DN0 signal/DN1 signal/DN2 signal applied to the current-controlled oscillator illustrated in FIG. 9A.

The UP0 signal (here, the UPB0 signal is a signal obtained by inverting the UP0 signal) and the DN0 signal are the same as the UP signal and the DOWN signal output from a phase detector, and the UP1 signal (here, the UPB1 signal is a signal obtained by inverting the UP1 signal) and the DN1 signal may be obtained by delaying the input UP signal/DOWN signal for a desired (or, alternatively, a predetermined) period of time and performing bit inversion on the delayed UP/DOWN signals. The UPB2 signal and the DN2 signal may be signals obtained by performing bit inversion at a (or, alternatively, a predetermined) period of time advanced from of the UP/DOWN signals. FIG. 9B is a view of a circuit generating the UPB0 signal/UPB1 signal/UPB2 signal/DN0 signal/DN1 signal/DN2 signal applied to the current-controlled oscillator illustrated in FIG. 9A.

Since the de-emphasis control method and the pre-emphasis control method are applied together according to the example embodiments of the inventive concepts, the clock and data recovery device may respond immediately to changes in input data even when the current supplied to the oscillator passes through a metal routing. In addition, since a variable capacitor connected to an output terminal of the oscillator is omitted, an operating frequency of the oscillator may increase.

Figure 10:
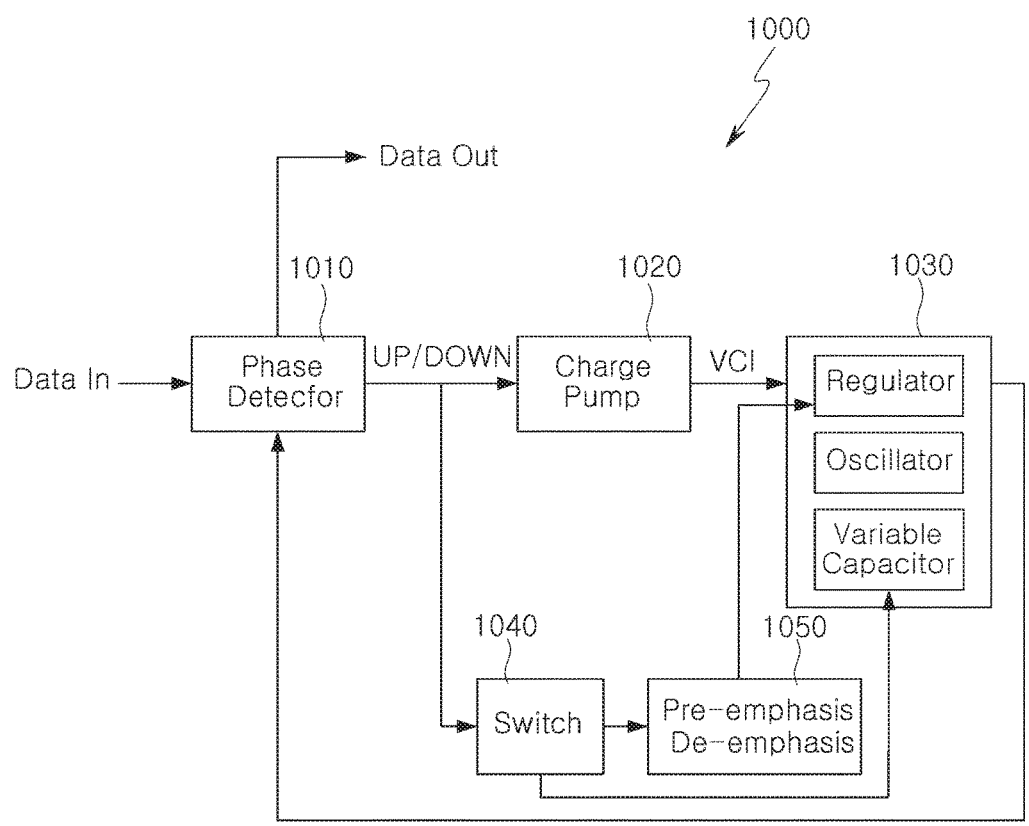
FIG. 10 is a block diagram illustrating a clock and data recovery device according to another example embodiment of the inventive concepts.

FIG. 10 is a block diagram illustrating a clock and data recovery device according to another example embodiment of the inventive concepts.

Referring to FIG. 10, a clock and data recovery device 1000 according to example embodiments of the inventive concepts may include a phase detector 1010, a charge pump 1020, a current-controlled oscillator 1030, a switch 1040, and a de-emphasis/pre-emphasis controller 1050. Since the phase detector 1010 and the charge pump 1020 are similar to or the same as the phase detector 210 and the charge pump 220 described with reference to FIG. 2, duplicated descriptions thereof will be omitted.

The current-controlled oscillator 1030 may include an oscillator generating a clock signal, a regulator supplying current to the oscillator, and a variable capacitor connected to an output terminal of the oscillator.

The switch 1040 may operate to select one of controlling by the phase detector 1010 and controlling by the de-emphasis/pre-emphasis controller 1050. For example, a controller (not shown) may determine whether an operating frequency of the clock and data recovery device 1000 is lower than a desired (or, alternatively, a predetermined) frequency.

The controller (not shown) may instruct the switch 1040 to switch to control the de-emphasis/pre-emphasis controller 1050 when the operating frequency of the clock and data recovery device 1000 is lower than the desired (or, alternatively, the predetermined) frequency such that the number of delay cycles of the UP/DOWN signal and the number of additional current sources and current branches may be reduced using the de-emphasis/pre-emphasis controller 1050. Accordingly, the increase in circuit areas may be minimized.

The controller (not shown) may instruct the switch 1040 to switch to control the phase detector 1010 when the operating frequency of the clock and data recovery device 1000 is greater than or equal to the desired (or, alternatively, the predetermined) frequency. Thus, since the variable capacitor is used only in high speed operations to apply the UP/DOWN signals to the oscillator, the capacitance of the variable capacitor connected to the output terminal of the oscillator may be minimized.

Figure 11:
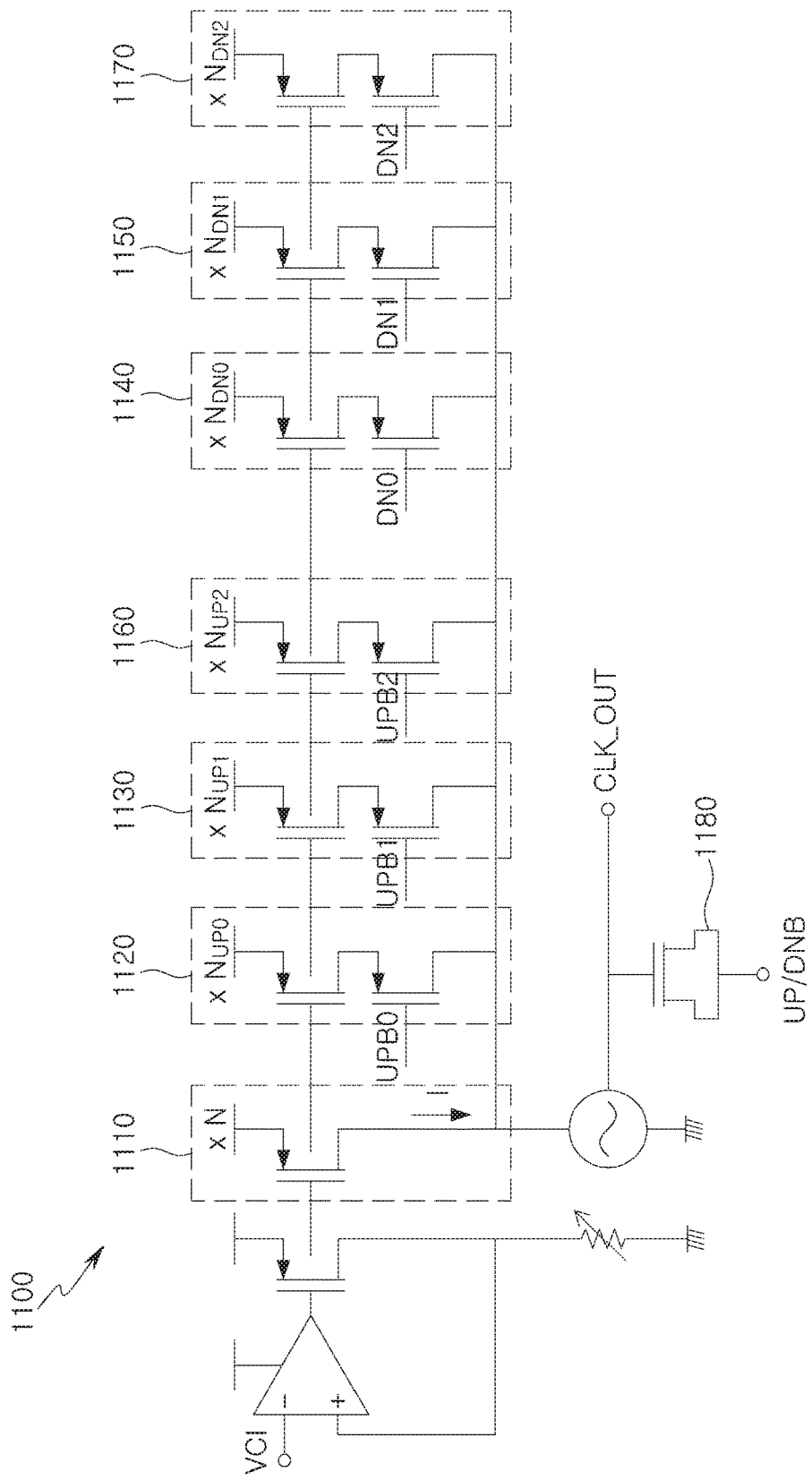
FIG. 11 is a circuit diagram illustrating a current-controlled oscillator, used in the clock and data recovery device illustrated in FIG. 10, according to another example embodiment of the inventive concepts.

FIG. 11 is a circuit diagram illustrating an example embodiment of a current-controlled oscillator used in the clock and data recovery device illustrated in FIG. 10.

Referring to FIG. 11, a current-controlled oscillator 1100 according to example embodiments of the inventive concepts, similar to the current-controlled oscillator 1030 illustrated in FIG. 9, may include current sources 1110 to 1170 and an oscillator, and may further include a variable capacitor 1180.

The current sources 1110 to 1170, similar to the current sources 910 to 970 illustrated in FIG. 9, may include N main current sources 1110 and auxiliary current sources 1120 to 1170 connected to the N main current sources 1110 in parallel. The auxiliary current sources 1120 to 1170 may be controlled by a de-emphasis control signal and a pre-emphasis control signal.

When the de-emphasis/pre-emphasis control is selected since an operating frequency of the clock and data recovery device is lower than a desired (or, alternatively, a predetermined) frequency, the de-emphasis control signal and the pre-emphasis control signal may be applied to the auxiliary current sources 1120 to 1170. The auxiliary current sources 1120 to 1170 may receive the de-emphasis control signal and the pre-emphasis control signal to adjust current supplied to the oscillator. When the auxiliary current sources 1120 to 1170 are controlled by the de-emphasis control signal and the pre-emphasis control signal, the variable capacitor 1180 may not operate.

When the operation frequency of the clock and data recovery device is higher than the desired (or, alternatively, the predetermined) frequency, the variable capacitor 1180 may be selected instead of the de-emphasis/pre-emphasis control signals. In this case, a control signal output from the phase detector 1010 may be applied to the variable capacitor 1180, and a frequency of the oscillator may be controlled by the variable capacitor 1180.

Figure 12:
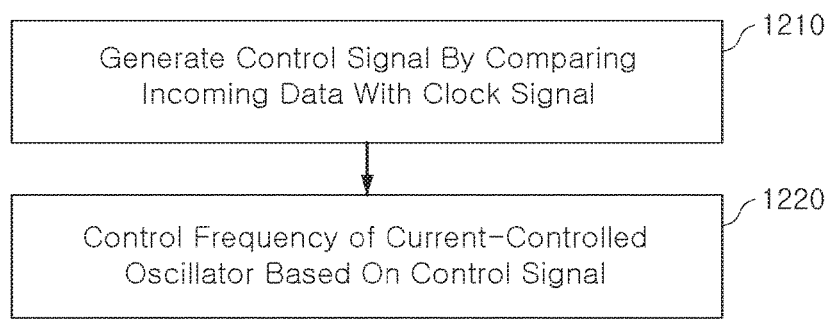
FIG. 12 is a flowchart illustrating a clock and data recovery method according to an example embodiment of the inventive concepts.

FIG. 12 is a flowchart illustrating a clock and data recovery method according to an example embodiment of the inventive concepts.

Referring to FIG. 12, in operation 1210, a phase detector of a clock and data recovery device (e.g., the phase detector 610 of the clock and data recovery device 600) according to example embodiments of the inventive concepts may receive transmitted data and a clock signal generated in an oscillator to compare the received data with the clock signal. The phase detector may generate a control signal based on a result of the comparison to synchronize the clock signal with the received data. For example, the phase detector may output an UP signal to increase a frequency of the clock signal, and a DOWN signal to decrease the frequency of the clock signal.

In operation 1220, a current-controlled oscillator of the clock and data recovery device may receive the control signal (UP/DOWN signals) output from the phase detector, and control the frequency of the oscillator based on the control signal.

For example, when the current-controlled oscillator receives the UP signal, the current-controlled oscillator may increase the frequency of the oscillator by increasing the amount of current supplied to the oscillator by controlling current sources. Alternatively, when the current-controlled oscillator receives the DOWN signal, the current-controlled oscillator may decrease the frequency of the oscillator by decreasing the amount of current supplied to the oscillator by controlling the current sources. In particular, the current-controlled oscillator may adjust the amount of current supplied to the oscillator by controlling the current sources using the pre-emphasis/de-emphasis control method. The pre-emphasis control method and the de-emphasis control method will be described with reference to FIG. 13 and FIG. 14, respectively.

Figure 13:
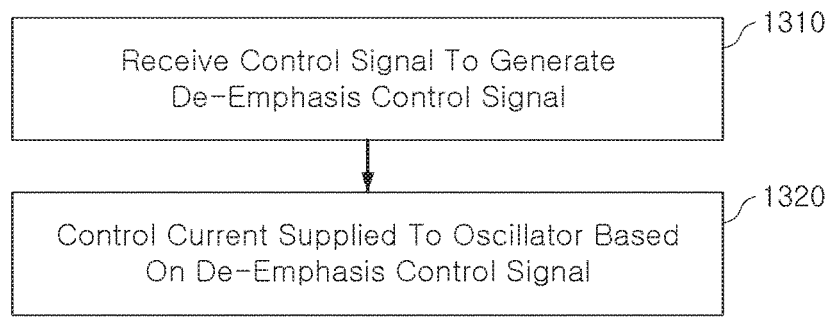
FIG. 13 is a flowchart illustrating a de-emphasis control method according to an example embodiment of the inventive concepts.

FIG. 13 is a flowchart illustrating a de-emphasis control method according to an example embodiment of the inventive concepts.

In operation 1310, a clock and data recovery device according to example embodiments of the inventive concepts may generate a de-emphasis control signal for de-emphasis control based on a control signal output from a phase detector.

For example, when the phase detector outputs an UP signal as described above with reference to FIG. 8, an UP0 signal and a UP1 signal acting as the de-emphasis control signal may be generated based on the UP signal. (Here, the UPB0 signal and the UPB1 signal illustrated in FIG. 8 are signals obtained by inverting the UP0 signal and the UP1 signal. The non-inverted signals UP0, UP1 and the inverted signals UPB0, UPB1 may be selectively used depending on the circuit configuration of the current-controlled oscillator.) The UP0 signal may be the same as the UP signal, and the UP1 signal may be obtained by delaying the UP signal for a desired (or, alternatively, a predetermined) period of time and inverting the delayed UP signal.

In operation 1320, the clock and data recovery device according to example embodiments of the inventive concepts may control current supplied to the oscillator based on the de-emphasis control signal.

For example, the current supplied to the oscillator may ideally decrease after a certain period of time, but actually gradually increase due to the influence of a metal routing, as illustrated in FIG. 8. Here, an increasing rate of the current supplied to the oscillator may be faster than an increasing rate of the current supplied to the oscillator in a case in which the UP1 signal is not generated. That is, changes in input data may be immediately reflected in the current supplied to the oscillator due to the de-emphasis control.

Figure 14:
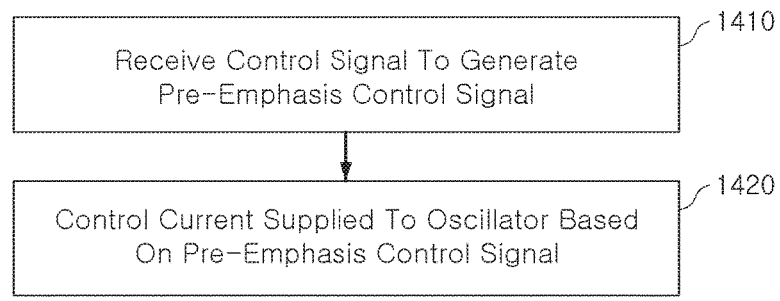
FIG. 14 is a flowchart illustrating a pre-emphasis control method according to an example embodiment of the inventive concepts.

FIG. 14 is a flowchart illustrating a pre-emphasis control method according to an example embodiment of the inventive concepts.

Referring to FIG. 14, a clock and data recovery device according to example embodiments of the inventive concepts may generate a pre-emphasis control signal for the pre-emphasis control based on a control signal output from a phase detector.

For example, when the phase detector outputs an UP signal, an UP0 signal and an UP2 signal acting as the pre-emphasis control signal may be generated from the UP signal. The UP0 signal may be the same as the UP signal, and the UP2 signal may be obtained by inverting the UP signal by a desired (or, alternatively, a predetermined) period of time ahead of the UP signal.

In operation 1420, the clock and data recovery device according to example embodiments of the inventive concepts may control the current supplied to the oscillator based on the pre-emphasis control signal. Like the de-emphasis control method, changes in the input data may be immediately reflected in the current supplied to the oscillator due to the pre-emphasis control.

Figure 15:
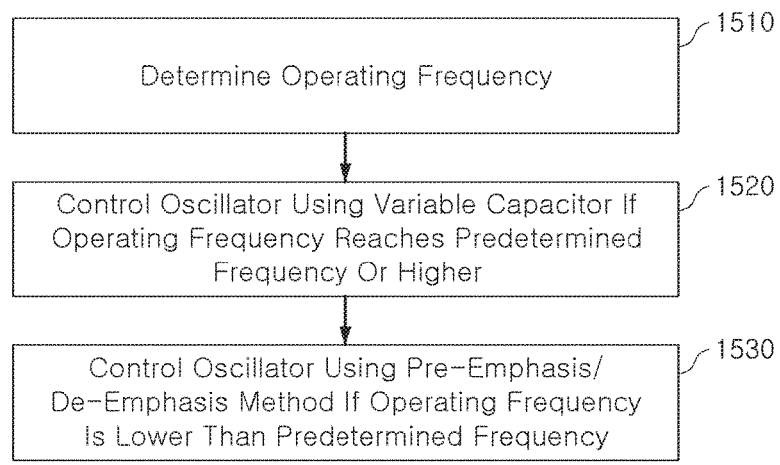
FIG. 15 is a flowchart illustrating a selective control method according to an example embodiment of the inventive concepts.

FIG. 15 is a flowchart illustrating a selective control method according to an example embodiment of the inventive concepts.

Referring to FIG. 15, when the oscillator is controlled using current, the operating frequency range of the oscillator may widen, In this case, however, the oscillator may require performing several cycles of delayed pre-emphasis/de-emphasis to have the same bandwidth in a wide frequency range. When the number of current sources increases, the entire circuit area may increase. In addition, the UP/DOWN signals may need to be delayed by several cycles, resulting in increase of the number of gates of transistors. When the oscillator is controlled using a variable capacitor, the oscillator may have a narrow frequency range and high power consumption. In addition, in order to ensure the low speed operation of the clock and data recovery device which operates at high speed, multiple capacitors may need to be connected to an output terminal of the oscillator, which limits the frequency range and leads to excessive power consumption.

To solve the above-described problems, the selective control method according to example embodiment of the inventive concepts may allow the oscillator to be controlled using current or using a variable capacitor, selectively.

In operation 1510, a controller (not shown) may determine an operating frequency of the clock and data recovery device. The controller may determine the operating frequency of the clock and data recovery device according to a frequency of the oscillator. The controller may compare the determined operating frequency with a desired (or, alternatively, a predetermined) frequency.

In operation 1520, when the operating frequency is greater than or equal to the desired (or, alternatively, the predetermined) frequency, the controller may set the oscillator to be controlled by the variable capacitor. For example, the controller may instruct the switch 1040 to select controlling by the phase detector 1010.

In operation 1530, when the operating frequency is lower than the desired (or, alternatively, the predetermined) frequency, the controller may set the oscillator to be controlled by the current. For example, the controller may instruct the switch 1040 to select controlling by the de-emphasis/pre-emphasis controller 1050.

The method of controlling the oscillator using the current may include the pre-emphasis control method described above with reference to FIG. 13 and the de-emphasis control method described above with reference to FIG. 14. The method of controlling the oscillator using the current according to example embodiments of the inventive concepts may use both of the pre-emphasis control method and the de-emphasis control method.

As set forth above, a clock and data recovery device according to example embodiments of the inventive concepts may serve to remove a variable capacitor directly connected to an oscillator, compared to a clock and data recovery device including a normal current-controlled oscillator. In addition, the clock and data recovery device according to the example embodiments of the inventive concepts may immediately reflect phase changes of input data, while increasing an operating frequency of a current-controlled oscillator.

According to one or more example embodiments, the units and/or devices described above, such as the components of the receiver 140 including certain component of the clock and data recovery device and certain sub-components thereof including the phase detector, pre-emphasis/emphasis controller, switch and controller may be implemented using hardware, a combination of hardware and software, or a non-transitory storage medium storing software that is executable to perform the functions of the same. These components may be embodied in the same hardware platform or in separate hardware platforms.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media.

The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments have been shown and described above, it will be apparent to those skilled in the art that modifications and variations could be made without departing from the scope of the example embodiments of the inventive concepts as defined by the appended claims.

What is claimed is:

1. A clock and data recovery device associated with a data receiving apparatus, comprising:
   an oscillator configured to generate a clock signal; and
   a regulator configured to supply current to the oscillator, the regulator including,
   a first current source configured to supply a first current to the oscillator, and
   a second current source configured to supply a second current to the oscillator such that the second current is supplied to the oscillator, after a period of time, to de-emphasize the first current, the period of time being based on the first current.

2. The clock and data recovery device of claim 1, wherein the regulator comprises:
   a third current source configured to supply a third current to the oscillator such that the third current is supplied to the oscillator before the period of time to pre-emphasize the first current.

3. The clock and data recovery device of claim 1, further comprising:
a phase detector configured to receive incoming data and an output signal of the oscillator, and to output a control signal based on a phase of the incoming data and a phase of the output signal of the oscillator.

4. The clock and data recovery device of claim 3, wherein the phase detector is configured to output a first control signal as the control signal when the phase of the incoming data is ahead of the phase of the output signal of the oscillator.

5. The clock and data recovery device of claim 4, wherein the regulator is configured to receive the first control signal output from the phase detector, and to increase a frequency of the oscillator by supplying current to the oscillator based on the first control signal.

6. The clock and data recovery device of claim 4, wherein the phase detector is configured to output a second control signal as the control signal when the phase of the output signal of the oscillator is ahead of the phase of the incoming data.

7. The clock and data recovery device of claim 6, wherein the regulator is configured to receive the second control signal from the phase detector, and to decrease a frequency of the oscillator by supplying current to the oscillator based on the second control signal.

8. The clock and data recovery device of claim 3, further comprising:
a charge pump configured to generate a voltage based on the control signal, and to output the voltage to the regulator to drive the regulator.

9. The clock and data recovery device of claim 8, wherein the first current source comprises:
a first transistor controlled by the voltage of the charge pump, and
a second transistor controlled by the control signal from the phase detector.

10. The clock and data recovery device of claim 8, wherein the clock and data recovery device is configured to generate a signal by delaying the control signal of the phase detector for a set period of time to generate a delayed control signal and inverting the delayed control signal to generate the signal, and the second current source comprises:
a first transistor controlled by the voltage of the charge pump, and
a second transistor controlled by the signal.

11. A clock and data recovery device associated with a data receiving apparatus, comprising:
an oscillator configured to generate a synchronized clock signal, the data receiving apparatus configured to receive incoming data based on the synchronized clock signal;
a variable capacitor configured to selectively adjust a frequency of the oscillator when the oscillator is operated at a frequency higher than a set frequency; and
a regulator configured to supply current to the oscillator, and to selectively adjust the frequency of the oscillator by adjusting the current supplied to the oscillator when the oscillator is operated at a frequency lower than the set frequency.

12. The clock and data recovery device of claim 11, wherein the regulator comprises:
a first current source configured to supply a first current to the oscillator, and
a second current source configured to supply a second current to the oscillator such that the second current is supplied to the oscillator, after a period of time to de-emphasize, the period of time being based on the first current.

13. The clock and data recovery device of claim 12, wherein the regulator comprises a third current source configured to supply a third current to the oscillator such that the third current is supplied before the period of time to pre-emphasize the first current.

14. The clock and data recovery device of claim 12, further comprising:
a phase detector configured to receive the incoming data and an output signal of the oscillator, and to output a control signal based on a phase of the incoming data and a phase of the output signal of the oscillator.

15. The clock and data recovery device of claim 14, wherein the phase detector is configured to output a first control signal as the control signal when the phase of the incoming data is ahead of the phase of the output signal of the oscillator.

16. The clock and data recovery device of claim 15, wherein the regulator is configured to receive the first control signal from the phase detector, and to increase a frequency of the oscillator by supplying current to the oscillator based on the first control signal.

17. The clock and data recovery device of claim 15, wherein the phase detector is configured to output a second control signal as the control signal when the phase of the output signal of the oscillator is ahead of the phase of the incoming data.

18. The clock and data recovery device of claim 17, wherein the regulator is configured to receive the second control signal from the phase detector, and to decrease a frequency of the oscillator by supplying current to the oscillator based on the second control signal.

19. The clock and data recovery device of claim 14, further comprising:
a charge pump configured to generate a voltage based on the control signal, and to output the voltage to the regulator to drive of the regulator.

20. The clock and data recovery device of claim 19, wherein the first current source comprises:
a first transistor controlled by an output voltage from the charge pump, and
a second transistor controlled by the control signal from the phase detector.

* * * * *